United States Patent [19]

Vandergraaf

[11] 4,456,892
[45] Jun. 26, 1984

[54] TEMPERATURE COMPENSATING CIRCUIT FOR USE WITH CRYSTAL OSCILLATORS AND THE LIKE

[75] Inventor: Johannes J. Vandergraaf, Lynchburg, Va.

[73] Assignee: General Electric Company, Lynchburg, Va.

[21] Appl. No.: 320,424

[22] Filed: Nov. 12, 1981

[51] Int. Cl.³ .............................................. H03L 1/02
[52] U.S. Cl. ..................................... 331/176; 331/66; 310/315
[58] Field of Search .................. 331/66, 176; 310/315

[56] References Cited

U.S. PATENT DOCUMENTS

| | | | |
|---|---|---|---|
| 3,373,379 | 3/1968 | Black | 331/116 |
| 3,454,903 | 7/1969 | Page | 331/176 X |
| 3,831,111 | 8/1974 | Lafferty | 331/176 X |
| 3,970,966 | 7/1976 | Keller et al. | 331/176 X |
| 4,096,452 | 6/1978 | Waku et al. | 331/116 |

Primary Examiner—Siegfried H. Grimm
Assistant Examiner—W. R. Paxman
Attorney, Agent, or Firm—James J. Williams

[57] ABSTRACT

A temperature compensating circuit for a piezoelectric crystal includes a thermistor circuit coupled to a transistor to cause the output voltage derived from the transistor to decrease as the temperature increases from a cold temperature toward a middle temperature. As the temperature increases still more, the thermistor causes the transistor to become saturated, and its output voltage increases. An additional thermistor circuit is coupled to the transistor output to cause the output voltage to decrease as the temperature increases toward a warm temperature from the temperature at which the transistor became saturated.

8 Claims, 6 Drawing Figures

TEMPERATURE COMPENSATING CIRCUIT FOR USE WITH CRYSTAL OSCILLATORS AND THE LIKE

BACKGROUND OF THE INVENTION

My invention relates to a temperature compensating circuit, and particularly to a temperature compensating circuit for providing a temperature compensating voltage to a voltage variable capacitor (Varicap diode) in a crystal oscillator.

While oscillators with piezoelectric crystals do have relatively stable frequencies, the crystals are sensitive to variations in temperature. For example, such crystals oscillate at a decreasing frequency as the temperature falls below a specified temperature (such as 0° C.). The crystals oscillate at a decreasing frequency, and then an increasing frequency as the temperature rises above the specified temperature (0° C.).

SUMMARY OF THE INVENTION

Briefly, my invention provides an improved temperature compensating circuit which, in one embodiment, comprises a cool temperature path having a thermistor and a resistor connected to a transistor to provide a compensating voltage that changes in a first direction as the temperature falls below a specified temperature. This voltage is applied to a voltage variable capacitor in a crystal oscillator to compensate for a decrease in the crystal oscillating frequency below the specified temperature. As the temperature rises above the specified value, the transistor provides a compensating voltage that also changes in the first direction. As the temperature rises still further, the transistor becomes saturated to stop the change in the compensating voltage. For still warmer temperatures, a second thermistor is connected to the transistor to provide a compensating voltage that changes in a second direction.

BRIEF DESCRIPTION OF THE DRAWINGS

The subject matter which I regard as my invention is particularly pointed out and distinctly claimed in the claims. The structure and operation of my invention, as well as advantages, may be better understood from the following description given in connection with the accompanying drawing in which:

DESCRIPTION OF THE PREFERRED EMBODIMENT

Figure 4:
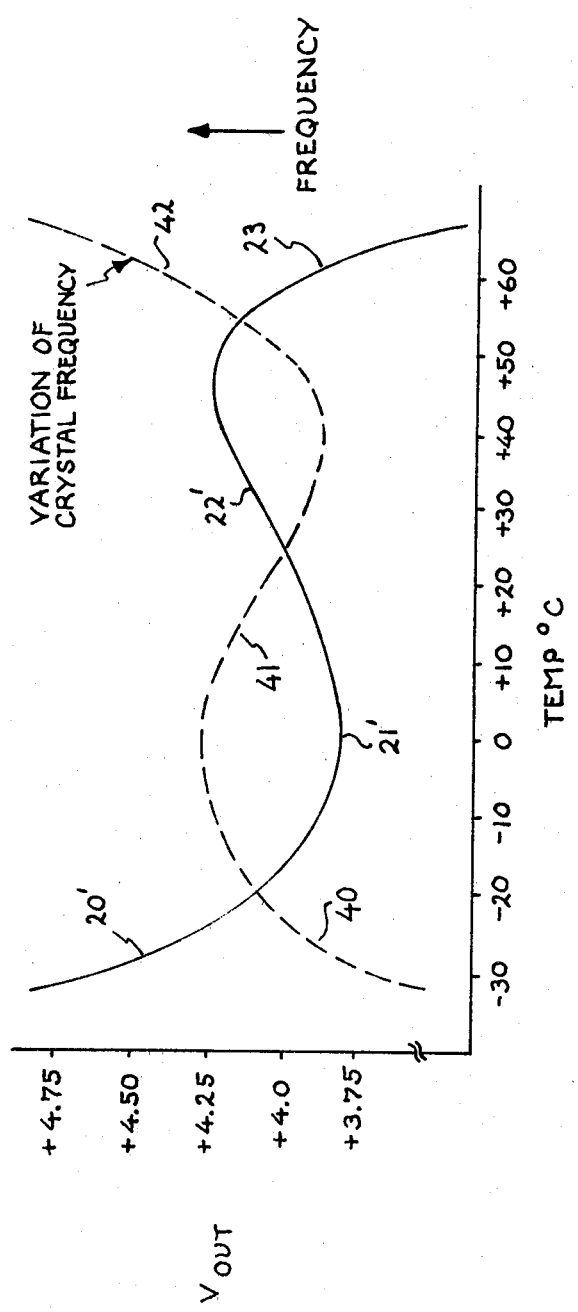
FIG. 4 shows curves illustrating the operation of my circuit of FIG. 3.

Before the various circuits of my invention are described, reference should be made to the dashed line curve shown in FIG. 4. This curve shows an example of the variation in oscillating frequency of a typical crystal as a function of temperature. Thus, for a specified temperature of 0° C., the oscillating frequency of the crystal decreases as the temperature gets colder as indicated by the portion 40. As the temperature rises above 0° C., the oscillating frequency of the crystal also decreases, as indicated by the portion 41. The frequency reaches a low point at about +40° C. As the temperature gets still warmer, the oscillating frequency of the crystal increases as indicated by the portion 42. It will be apparent then that where a crystal must operate over relatively wide temperature ranges (such as −30° C. to +60° C. for example), some arrangement is needed to compensate for the variations in the crystal oscillating frequency, so that the oscillator controlled by the crystal has a relatively stable frequency. The embodiments of my invention provide such a compensation by producing a voltage which varies in a reverse or opposite manner from the variations illustrated by the dashed line curve of FIG. 4. As known in the art, these variations in voltage are applied to a voltage variable capacitor (such as a Varicap diode) which is connected into the crystal oscillator circuit in such a manner that the capacity of the Varicap diode varies so as to correct or compensate for the oscillating frequency changes of the crystal. Thus, the oscillator frequency can be held relatively stable over a fairly wide range of temperatures.

Figure 1:
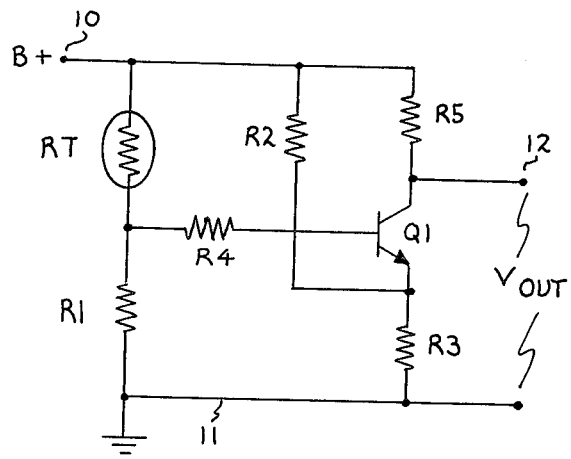
FIG. 1 shows a schematic diagram of a first embodiment of my invention.

FIG. 1 shows one preferred embodiment of a compensating circuit in accordance with my invention for providing a temperature compensating voltage for the cool and middle temperature ranges. My circuit includes a suitable source of direct current voltage B+ applied to a terminal 10 with respect to a reference or ground terminal 11. A thermistor RT and a normal resistor R1 are connected in a first series circuit between the terminals 10, 11 to provide temperature control. As known in the art, the thermistor RT has a resistance characteristic which varies inversly with temperature. Thus, as the temperature decreases, the resistance of the thermistor RT increases; and as the temperature increases, the resistance of the thermistor RT decreases. A second series circuit is connected between the terminals 10, 11. This second circuit includes a resistor R5, the collector-emitter electrodes of an NPN type transistor Q1, and a resistor R3. A resistor R4 connects the junction of the thermistor RT and the resistor R1 to the control electrode or base of the transistor Q1. A biasing resistor R2 is connected between the terminal 10 and the emitter of the transistor Q1. An output terminal 12 is connected to the collector of the transistor Q1 for deriving an output voltage relative to the terminal 11.

Figure 2:
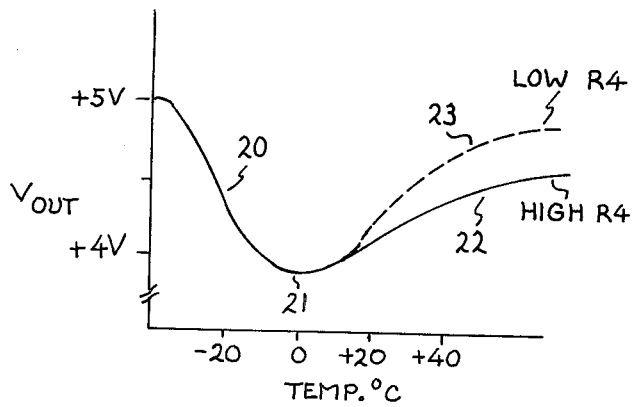
FIG. 2 shows a curve illustrating the operation of my circuit of FIG. 1.

FIG. 2 shows a curve illustrating the operation of my circuit of FIG. 1 for one set of circuit values. At the cooler temperatures, for example, −40° C., the thermistor RT has a relatively high resistance so that the base voltage of the transistor Q1 is relatively low and the output voltage is relatively high. As the temperature gets warmer, the resistance of the thermistor RT decreases and the base voltage of the transistor Q1 increases. The transistor Q1 begins to conduct more, and the output voltage decreases as indicated by the portion 20 of the curve. At some selected temperature, and depending partially on the characteristic selected for the thermistor RT, the output voltage reaches a minimum at the point 21. At this point 21, the low resistance of the thermistor RT provides a base voltage that saturates the transistor Q1. That is, the collector, the base, the emitter voltages approach one another within a fraction of a volt. As the temperature continues to increase, the base voltage continues to increase and raise the collector voltage with it. Hence the output voltage is raised also, as illustrated by the portion 22 of the curve. This portion 22 tends to level off at some temperature, depending upon the characteristics of the various circuit elements. The exact point at which the portion 22 tends to level off is determined primarily by the magnitude of the resistor R4. As the magnitude of the resistor R4 is decreased, the portion 22 tends to be moved upward as illustrated by the dashed portion 23, because the pulling effect of the thermistor RT is greater.

A comparison of the curve shown in FIG. 2 with the portions 40, 41 of the dashed line curve of FIG. 4 will show that a compensating voltage is provided for the cooler and middle range temperatures. This compensating voltage is provided by a relatively simple circuit, and meets the needs of many applications, such as oscillators whose frequency stability is not critical at the higher or warmer temperature ranges.

Figure 3:
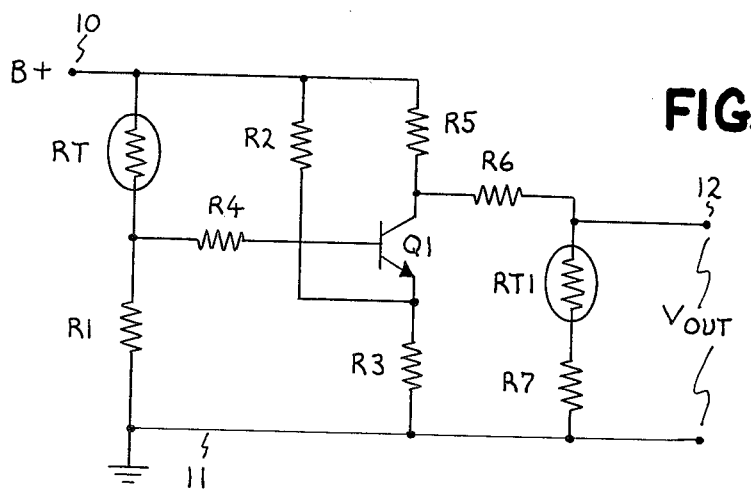
FIG. 3 shows a schematic diagram of a second embodiment of my invention.

In applications where greater frequency stability is needed at the warmer temperatures, as well as the middle and cooler temperatures, my circuit of FIG. 3 provides a suitable compensating voltage. FIG. 3 is similar to FIG. 1, and corresponding parts have been given the same reference numerals. An additional or third circuit, to provide control in the warm temperature range, is connected between the collector of the transistor Q1 and the reference terminal 11. This additional circuit includes a first resistor R6, a second thermistor RT1, and a resistor R7. The output terminal 12 is connected to the junction of the resistor R6 and the thermistor RT1. Operation of the circuit of FIG. 3 is explained in connection with the voltage or solid line curve of FIG. 4. At the cool and middle temperatures, the operation is similar to that of the circuit of FIG. 1 and as illustrated by the portions 20', 21', 22' which correspond to the portions 20, 21, 22 of FIG. 2. However, as the temperature continues to increase, the magnitude of the second thermistor RT1 decreases appreciably, with the result that the output voltage is reduced as illustrated by the portion 23 of the curve shown in FIG. 4. A comparison of the compensating voltage or solid line curve of FIG. 4 with the frequency variation dashed line curve of FIG. 4 illustrates the compensating effect of the circuit of FIG. 3 relative to variations in crystal frequency, both with respect to temperature.

Figure 5:
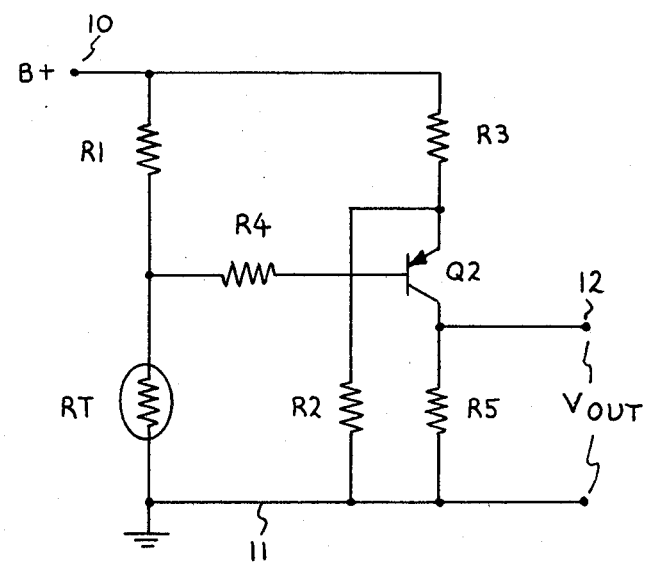
FIGS. 5 and 6 show circuits similar to FIGS. 1 and 2, but with a different type of transistor.
Figure 6:
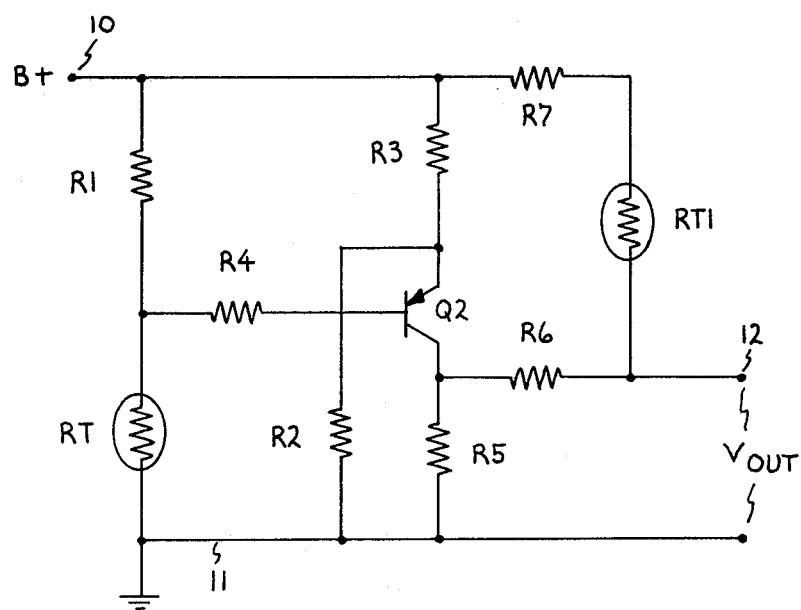

Persons skilled in the art will appreciate that a PNP type transistor may be used in place of an NPN type transistor. FIGS. 5 and 6 show the circuit connections for a PNP type transistor Q2. FIG. 5 is similar or analogous to FIG. 1 and provides compensating voltages at the cool and middle temperature ranges. FIG. 6 is analogous to FIG. 3, and provides compensating voltages for the cool, middle, and warm temperature ranges.

It will thus be seen that I have provided new and improved temperature compensating circuits for use with voltage variable capacitors in crystal oscillators and the like. While I have shown a selected number of embodiments, persons skilled in the art will appreciate that modifications may be made. For example, the exact characteristics and magnitudes of the thermistors and resistors may be varied to suit selected needs. The resistor R4 may be replaced by a direct connection between the transistor base and the junction of the thermistor RT and the resistor R1. In such a modification, a resistor may be inserted in series between the thermistor RT and the terminal 10, depending upon the desired circuit operation. Other types of semiconductor devices may be used in place of the transistors Q1, Q2. However, I do prefer transistors which become saturated so that the base voltage can vary the collector voltage when the transistor becomes saturated. Therefore, while I have described my invention with reference to particular embodiments, it is to be understood that modifications may be made without departing from the spirit of the invention or from the scope of the claims.

What I claim as new and desire to secure by Letters Patent of the United States is:

1. An improved temperature compensating circuit for use with crystal oscillators and the like comprising:
   a. first and second voltage source terminals;
   b. a control circuit connected between said first and second source terminals, said control circuit comprising:
      1. a thermistor connected between said first source terminal and a first junction;
      2. a resistor connected between said first junction and said second source terminal;
      3. a resistor connected between said first source terminal and a second junction;
      4. a semiconductor device having current electrodes connected between said second junction and a third junction, and having a control electrode;
      5. a resistor connected between said third junction and said second source terminal;
      6. a direct current path of selected impedance connected between said first junction and said control electrode;
      7. a resistor connected between said first source terminal and said third junction;
   c. and means for deriving an output from said second junction and one of said source terminals;
   d. said thermistor being selected to cause saturation of said semiconductor device at a predetermined temperature and control the output at said second junction as the temperature increases above said predetermined temperature.

2. The improved circuit of claim 1 wherein said semiconductor device is an NPN transistor having its collector connected to said second junction and its emitter connected to said third junction.

3. The improved circuit of claim 1 wherein said semiconductor device is a PNP transistor having its collector connected to said second junction and its emitter connected to said third junction.

4. The improved circuit of claim 1 or claim 2 or claim 3 and comprising an additional control circuit connected between said second junction and said second source terminal, said additional control circuit comprising a thermistor and at least one resistor connected in series.

5. A temperature compensating circuit comprising:
   a. first and second terminals for connection to positive and negative direct current voltages respectively;
   b. a first thermistor and a first resistor connected in series in that order between said first and second terminals;
   c. a second resistor, the collector-emitter path of an NPN transistor, and a third resistor connected in series in that order between said first and second terminals;
   d. a fourth resistor of selected impedance connected between the base of said first transistor and the junction of said first thermistor and first resistor;
   e. a fifth resistor connected between said first terminal and said emitter of said transistor;

f. said thermistor decreasing in magnitude as its temperature increases above a pre-determined temperature level to saturate said transistor and raise said collector voltage as said base voltage is raised;

g. and means for deriving a compensating output voltage from said collector of said transistor.

6. The temperature compensating circuit of claim 5 wherein said means for deriving comprises an additional series circuit comprising a sixth resistor, a second thermistor, and a seventh resistor connected in series between said collector of said transistor and said second terminal, and wherein said output voltage is derived from said additional series circuit.

7. A temperature compensating circuit comprising:

a. first and second terminals for connection to positive and negative direct current voltages respectively;

b. a first resistor and a first thermistor connected in series in that order between said first and second terminals;

c. a second resistor, the emitter-collector path of a PNP transistor, and a third resistor connected in series in that order between said first and second terminals;

d. a fourth resistor of selected impedance connected between the base of said transistor and the junction of said first resistor and first thermistor;

e. a fifth resistor connected between said second terminal and said emitter of said transistor;

f. said thermistor decreasing in magnitude as its temperature increases above a pre-determined temperature level to saturate said transistor and lower said collector voltage as said base voltage is lowered;

g. and means for deriving a compensating output voltage from said collector of said transistor.

8. The temperature compensating circuit of claim 7 wherein said means for deriving comprises an additional series circuit comprising a sixth resistor, a second thermistor, and a seventh resistor connected in series between said collector of said transistor and said first terminal, and wherein said output voltage is derived from said additional series circuit.

* * * * *